(12) United States Patent
Hurst

(10) Patent No.: US 8,438,511 B1
(45) Date of Patent: May 7, 2013

(54) MINIMAL LOGIC DUPLICATION FOR PRESERVING RESET BEHAVIOR POST-RETIMING

(75) Inventor: Aaron Hurst, Berkeley, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 461 days.

(21) Appl. No.: 12/649,507

(22) Filed: Dec. 30, 2009

(51) Int. Cl.
G06F 17/50 (2006.01)

(52) U.S. Cl.
USPC .......................................... 716/104; 716/105

(58) Field of Classification Search ........... 716/100–104
See application file for complete search history.

(56) References Cited

U.S. PATENT DOCUMENTS 7,120,883 B1 * 10/2006 van Antwerpen et al. .... 716/102
7,945,880 B1 *  5/2011 Albrecht et al. .............. 716/105

OTHER PUBLICATIONS

Pan, Peichen, et al., "Optimal Retiming for Initial State Computation," Proc. Conf. on VLSI Design, 1999, 6 pages.
Singhal, Vigyan, et al., "The Case for Retiming With Explicit Reset Circuitry," Digest of Technical Papers, 1996 IEEE/ACM International Conference on Computer-Aided Design (ICCAD), Nov. 1996, pp. 618-625.

* cited by examiner

*Primary Examiner* — Binh Tat
(74) *Attorney, Agent, or Firm* — Holland & Knight LLP; Mark H. Whittenberger

(57) ABSTRACT

Methods, systems, and devices for logic synthesis that preserve a reset behavior of a circuit are provided. A method for logic synthesis may include providing the circuit. A memory element may be identified at a first location within the circuit, where the memory element is reset with a first reset value. The memory element may be relocated across a first portion of the circuit resulting in a one relocated memory element. The relocated memory element may be duplicated. The relocated memory element and the duplicated memory element may be connected with the circuit. Multiple reset values for the relocated memory element and the duplicated memory element may be determined, where the first reset value is produced at the first location when the multiple reset values are propagated through the circuit from the relocated memory element and the duplicated memory element to the first location.

21 Claims, 9 Drawing Sheets

Original Circuit

Uninitializable Backward Retiming

(iii) Fully BackwardRetimeable Circuit with Logic Duplication

Duplicated: full adder $FA_0$
register $R_{a0}$

US 8,438,511 B1

MINIMAL LOGIC DUPLICATION FOR PRESERVING RESET BEHAVIOR POST-RETIMING

BACKGROUND

This disclosure relates in general to electronic design automation (EDA) and, more specifically logic synthesis of a circuit involving retiming.

Retiming is a logic synthesis technique that structurally relocates registers in a design in a manner that preservers output functionality. It can be applied to minimize or meet a constraint on a worst-case combinational delay and/or to minimize the number of registers, merely by way of example. The original registers may have reset signals that restore them to specific logic values, and for the retimed circuit to be functionality equivalent, it should have the same behavior when a reset is asserted. This can often be achieved by selecting a corresponding set of reset values for the retimed registers. For some retimed circuits, however, no such set may exist; either the circuit structure or retiming transformation needs to be altered.

Merely by way of example, FIG. 1A provides one example of a portion of a circuit with no corresponding set of reset values that exist when the portion is retimed. In this example, registers $R_1$ and $R_2$ have initial reset values initialized to logic one. When this circuit is retimed with relocated registers $R'_x$ and $R'_y$, no set of reset values exist such that the retimed circuit has the same behavior when a reset is asserted. This may be referred to as an unjustifiable retiming.

There are several known approaches to handling an unjustifiable retiming. The problem may be how to accomplish this with minimal increase in area and worst-case timing.

One approach to handling an unjustifiable retiming is to constrain the mobility of the registers so that the result is justifiable and then to recompute retiming with constraints on the original circuit. This may not require modifying any combinational logic. Another approach is to unmap the reset functionality from the sequential state element; this may involve explicit reset circuitry. This may not be possible in all circuit styles, but if it can be done, the registers can then be retimed independently of the combinational reset logic.

A limitation with the first approach is that the constraint may limit the ability of retiming to improve the quality of the result. Timing-critical registers may be constrained from any backward movement at all, in which case these path delays can not be improved. Furthermore, the generation of optimal constraints may be a computationally intractable problem, in which case over-conservatism (and possible further loss in quality) may be necessary.

A limitation with the second approach may be that the additional combinational reset logic lengthens the path at the input of each backward-retimed register by at least one gate. These gates may also contribute additional area. These additions may compromise the total quality-of-results benefit from retiming the circuit.

There is thus a need for methods, apparatuses, and systems that may be used to create justifiable circuits as part of a retiming.

BRIEF SUMMARY

Embodiments provide methods, apparatuses, and systems that allow for registers and combinational logic to be strategically duplicated to generate identical reset behavior after retiming. Each gate input may be reconnected to one of the copies of its original driver. The retiming need not be constrained as a result. A full optimization potential of retiming may be preserved.

Embodiments may preserve the length and composition of the longest timing path. There may be no degradation in the load-independent delay over the best (and unjustifiable) retiming solution. In some embodiments, the number of circuit elements that are duplicated to make the retiming justifiable may be optimally minimal.

Some embodiments may include a method of logic synthesis for preserving a reset behavior of a circuit. The method may include providing the circuit. A memory element may be identified at a first location within the circuit, where the memory element is reset with a first reset value. The memory element may be relocated across at least a first portion of the circuit resulting in at least one relocated memory element. The at least one relocated memory element may be duplicated. The at least one relocated memory element and the at least one duplicated memory element may be connected with the circuit. A plurality of reset values for the at least one relocated memory element and the at least one duplicated memory element may be determined, where the first reset value may be produced at the first location when the plurality of reset values are propagated through the circuit from the at least one relocated memory element and the at least one duplicated memory element to the first location.

Some embodiments may include a system for performing logic synthesis that preserves a reset behavior of a circuit. The system may include a storage medium. The system may include a processor coupled with the storage medium. The processor may be configured to preserve the reset behavior of the circuit by a configuration to: provide the circuit; identify a memory element at a first location within the circuit; wherein the memory element is reset with a first reset value; relocate the memory element across at least a first portion of the circuit resulting in at least one relocated memory element; duplicate the at least one relocated memory element; connect the at least one relocated memory element and the at least one duplicated memory element with the circuit; and determine a plurality of reset values for the at least one relocated memory element and the at least one duplicated memory element, wherein the first reset value is produced at the first location when the plurality of reset values are propagated through the circuit from the at least one relocated memory element and the at least one duplicated memory element to the first location.

Some embodiments may include a machine-readable storage medium comprising executable instructions for performing a logic synthesis that preserves a reset behavior of a circuit. The executable instructions may comprising code for: providing the circuit; identifying a memory element at a first location within the circuit; wherein the memory element is reset with a first reset value; relocating the memory element across at least a first portion of the circuit resulting in at least one relocated memory element; duplicating the at least one relocated memory element; connecting the at least one relocated memory element and the at least one duplicated memory element with the circuit; and determining a plurality of reset values for the at least one relocated memory element and the at least one duplicated memory element, wherein the first reset value is produced at the first location when the plurality of reset values are propagated through the circuit from the at least one relocate memory element and the at least one duplicated memory element to the first location.

BRIEF DESCRIPTION OF THE DRAWINGS

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1A:
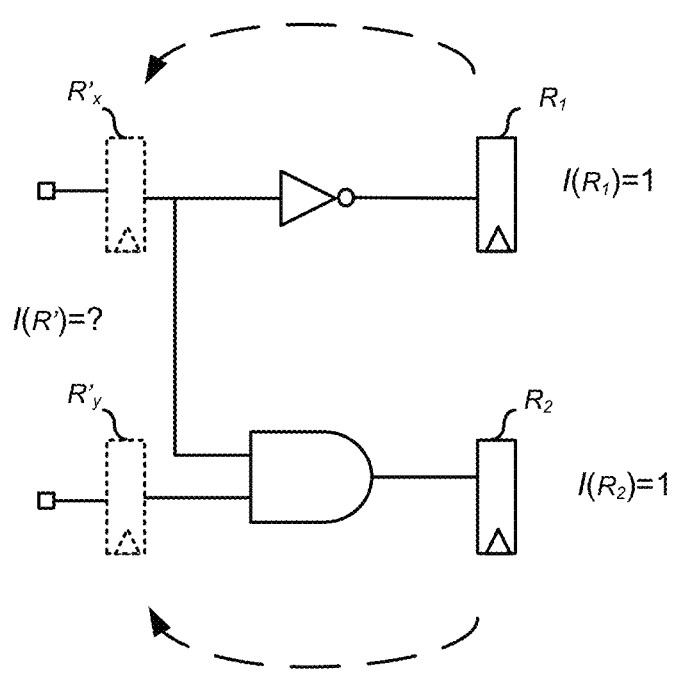
FIG. 1A illustrates a circuit diagram, in accordance with various embodiments.

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It being understood that various changes may be made in the function and arrangement of elements without departing from the spirit and scope as set forth in the appended claims.

The descriptions provide several examples according to various embodiments. Throughout these descriptions, numerous circuits and their components may be described. There are numerous ways to represent circuits and their elements during logic synthesis. In general with logic synthesis, circuits may be represented on different levels, including, but not limited to, behavior levels, a register-transfer levels (RTL), gate levels, transistor levels, and/or layout levels. Different hardware description languages (HDL) may be used to represent a circuit, including, but not limited to, VHDL and/or Verilog. In some embodiments, a circuit may also be represented as a netlist for example. Elements within the discussed circuits may also include a variety of elements, including both memory and combinational logic elements. Memory elements may include circuit elements that may possess an internal state; they may include, but are not limited to, registers, flip-flops, and latches. Combinational logic elements, which may be referred to as combinational elements herein, generally do not possess an internal state; they may include, but are not limited to, logic gates. Some embodiments may also involve libraries of elements; merely by way of example, embodiments involving technology mapping may map a target technology that may implement a technology independent network using elements from a specific library. While the descriptions may discuss specific circuits, these are for explanation purposes and do not limit the scope of the disclosure; one skilled in the art will recognize that the techniques described may be applied to other circuits in general.

Embodiments are provided for transforming the logic structure of a retimed circuit by duplicating logic such that the circuit can be reset to an equivalent initial state. In some embodiments, duplicated gates may preserve local connectivity between replicated gates: each copy may be connected to the same inputs and outputs (or copies thereof) as its parent in the original circuit. In some embodiments, additional logic that is introduced may be minimized. This may be accomplished in some embodiments by formulating a constraint on the weighted number of gates and registers that can be introduced in a problem. An optimization may include searching for a tightest feasible value of such a constraint. Embodiments duplicating existing logic may include the following properties: (i) there may be no restrictions on register retimeability, (ii) the delay along combinational paths may be maintained, and/or (iii) the additional logic used may be minimized (to an optimally minimal amount in some embodiments).

Embodiments may include modifying the combinational logic to make the circuit reset justifiable in ways that may preserve the load independent delay along timing paths. This may also involve a minimum amount of additional area without resorting to general resynthesis. Embodiments may also preserve a general circuit topology by utilizing logic duplication. Embodiments may include a method for transforming Boolean logic structures so that different possible set of output valuations can be produced.

The following description provides merely provides one way of describing retiming and a reset justification problem; other descriptions may be utilized within the scope and spirit of the description. A retiming graph may be described as a set of nodes V and edges E <V,E>. Initial edge weights $w_i(e)$ and retimed edge weights $w_r(e)$ may be given some lag function $r(v)$. Merely by way of example, to simplify the relationship between the pair-wise retiming graph and the netlist hypergraph under fanout register sharing in some embodiments, it may be assumed that for every node v, either $(\forall e{=}v{\rightarrow}u)(w_r(e){+}w_i(e){=}0)$, or $w_r(e){+}w_i(e){=}1$ and there is exactly one fanout. Some embodiments may make different assumptions, but still remain with the scope and spirit of this description. In some embodiments, a graph satisfying these requirements may be extracted after retiming by simply inserting temporary buffer nodes after the register locations have been determined; the algorithm need not be constrained in any way.

Merely by way of example, let $R=\{e: w_i(e){=}1\}$ be the registers in the original circuit. Because of the above property, one can map edges to registers and vice versa. Each register $r{=}v_r{\rightarrow}u$ may also have a single combinational driver $v_r$. Some circuits may include multiple reset signals in the design. Registers may be partitioned into reset classes and that those in R share the same signal in some cases. A connection of the reset signal to a preset-type input may initialize a register to logic one; a connection to a clear-type input may initializes a register to logic zero. The initial values upon reset may then be described by:

$$I(r){:}R{\rightarrow}\{0,1\}.$$

After a retiming, the resulting registers may be described as $R'=\{e: w_r(e)=1\}$. The output of a node v can be described by a function of the initial value assignments to the retimed registers:

$$F_v^c = 2^{R'} \to \{0,1\}$$

for the first $0 \leq c < r(v)$ cycles after retiming. It is a structural property of retiming that a node with positive retiming lag may contain only retimed registers in its support (and no inputs or other sequential elements). A function $F_{v_r}^{r(v_r)-1}$ may then describe the reset value of the original register output net in terms of the retimed register reset values.

A reset justification problem may then include finding a new set of initial values $I':R' \to \{0,1\}$ such that the initial values at the original register output net are identical:

$$(\forall r \in R)(F_{v_r}^{r(v_r)-1}(I'(R'))=I\{r\}).$$

In some retimed designs, there may exist no such satisfying I'.

An example of this problem is illustrated in FIG. 1A. If registers $R_1$ and $R_2$ which reset to logic one (i.e. $I(R_1)=I(R_2)=1$) are retimed backward to $R'_x$ and $R'_y$, it may not possible to produce equivalent values at the output nets of the original register at reset with any assignment of initial values to the retimed registers.

Embodiments are provided that involve logic transformations that are applicable to an unjustifiable circuit. In some embodiments, the transformation can be formulated as a single Boolean satisfiability (SAT) instance. Embodiments may offer a different set of tradeoffs than either explicit reset circuitry or retiming constraints, or other known methods for rectifying an unjustifiable circuit.

Figure 1B:
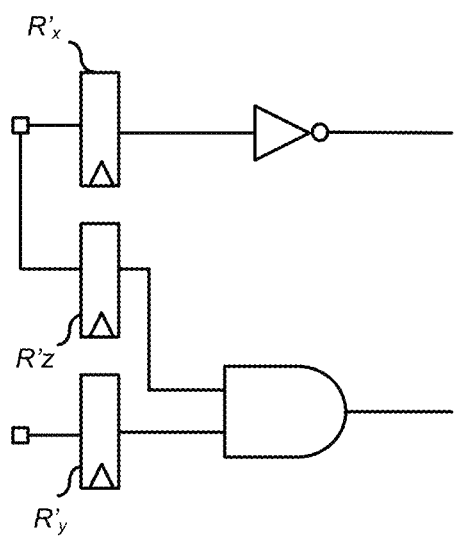
FIG. 1B illustrates a circuit diagram, in accordance with various embodiments.

Embodiments may involve duplicating a subset of registers and gates, or more generally, memory elements and combinational logic elements, to introduce enough additional values into a circuit to prove for reset equivalence. FIG. 1B provides merely one example. FIG. 1B includes the retimed circuit of FIG. 1A, which was unjustifiable, i.e. no initial reset values could be found for the retimed registers $R'_x$ and $R'_y$, to produce equivalent reset values at the output nets of the original registers $R_1$ and $R_2$. FIG. 1B shows the introduction of an additional register $R'_z$, which may be considered a duplication of $R'_x$ into the retimed circuit. Reset values may then be assigned to $R'_x$ and $R'_y$, and $R'_z$ to produce equivalent reset values at the output nets of $R_1$ and $R_2$: $I(R'_x)=0$, $I(R'_x)=1$, and $I(R'_z)=1$. While this example merely provides an example where a retimed register is duplicated, other embodiments may also include duplicating a portion of the combinational logic of a circuit, as described in more detail below.

Embodiments may include a local objective of duplicating an individual gate, or combinational logic element in general, to generate multiple different post-reset trace sequences. In some embodiments, a post-reset trace sequence $s \in S$ may be considered an r(v) element Boolean sequence at the output of a gate that may be determined entirely by the retimed initial state assignment. This may be structural consequence of retiming. For cases where $r(v) \leq 0$, s may be defined to be equal to Ø; in some cases, such gates need not be considered in detail.

In some embodiments, a gate may need to be duplicated to produce every such trace possible. This may result in up to $2^{(max\ 0,\ r(v))}$ copies. If a gate has multiple-outputs, one may need to also consider all such multi-bit traces.

The following description utilizes the following standard sequence operators for ease of notation: front, which returns the first element in the sequence, pop, which returns the non-first elements, and push, which concatenates an element to the end of the sequence. In some embodiments, the behavior is FIFO. Other descriptions may utilize other operators or notation.

Merely by way of example, let $f_v(i, j, \ldots)$ be a local function (i.e. in terms of its immediate fan-ins) of a combinational gate associated with each node v. Let $d(v,s):V \times S \to \{0,1\}$ be a Boolean function that indicates whether a copy exists of gate v that produces trace s of length r(v). One may refer to this instance as $v^s$ and say that it has been realized if $d(v,s)=1$. The number of copies of v may then be described as $$\sum_{\forall s} d(v, s).$$

When a gate is duplicated, each copy may be connected to the same drivers and loads or copies thereof. Set-wise connectivity may therefore be preserved in the groups of duplicated gates. The connectivity in the transformed circuit can be then described with the function $a(v,u,s): V \times V \times S \to S$, where $a(v,u,s)=t$ indicates that corresponding input of gate $v^s$ is driven by copy $u^t$. If there exists an original edge $u \to v$, then $\forall\{s:d(v,s)=1\}\exists\{t:d(u,t)=1\}$ such that a valid edge $u^t \to v^s$ exists at least one copy of every gate may be maintained.

In some embodiments, retimed registers may also be duplicated. This may be captured by the replication of the edges where $w_r(u \to v)=1$. Because the initial values of the resulting registers may be different, one may introduce a function $i(v,u,s): V \times V \times S \to \{0,1\}$ whose output indicates the initial value of the retimed register on the duplicated edge $u^{a(v,u,s)} \to v^s$. The domain of i can be limited to the edges where $w_r(u \to v)=1$.

Figure 2A:
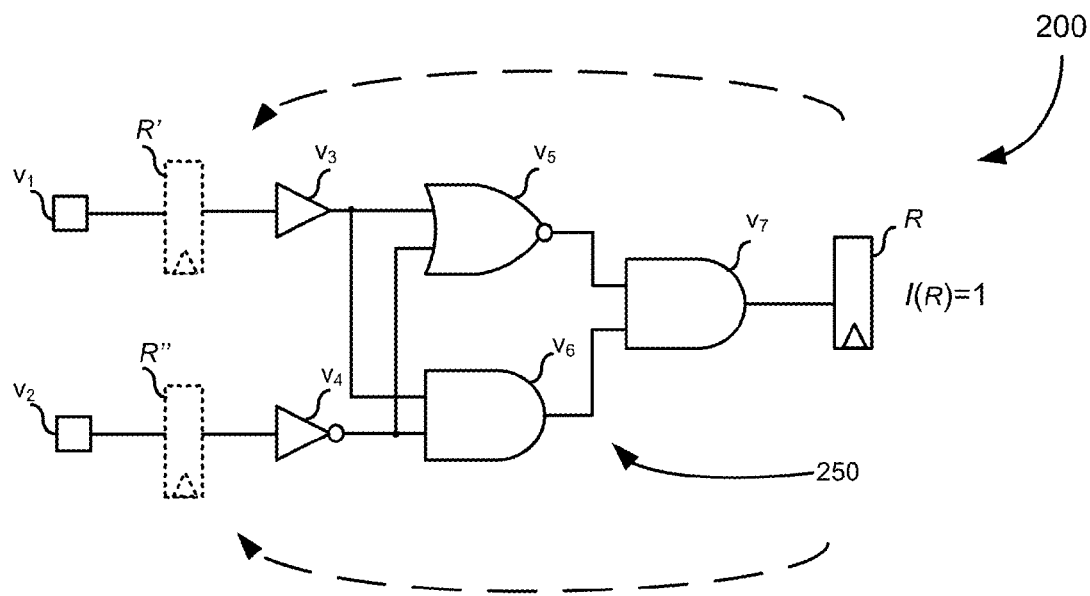
FIG. 2A illustrates a circuit diagram, in accordance with various embodiments.

Referring now to FIG. 2A, an example of retiming duplication in terms of the defined variables from above is illustrated. The figures shows circuit 200 with original register R with initial reset value equal 1 on the right and the two resulting backward retimed registers R' and R" to the left, over combinational logic 210, which includes gates $v_1$ to $v_7$. There may exist no initial value assignment for R' and R" that produces an initial value of 1 at the original register output.

Figure 2B:
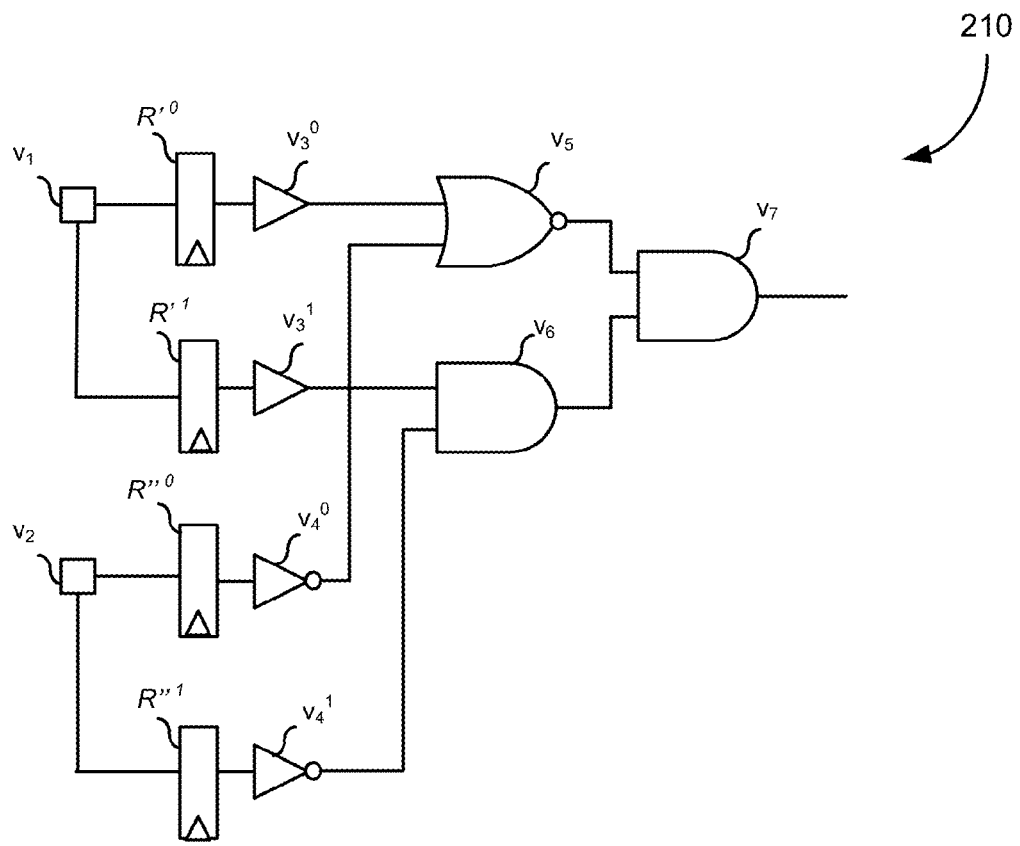
FIG. 2B illustrates a circuit diagram, in accordance with various embodiments.

Referring now to FIG. 2B, one possible solution employing retiming duplication is shown in accordance with various embodiments. FIG. 2B shows circuit 200 of FIG. 2A after retiming duplication has occurred, resulting in circuit 210. In this case, gates $v_3$ and $v_4$ of circuit 200 have been duplicated and shown as $v_3^1$ and $v_4^1$; in addition, retimed registers R' and R" have been duplicated as $R'^1$ and $R''^1$. These duplicated gates and registers have also been connected to the circuit.

Figure 2C:
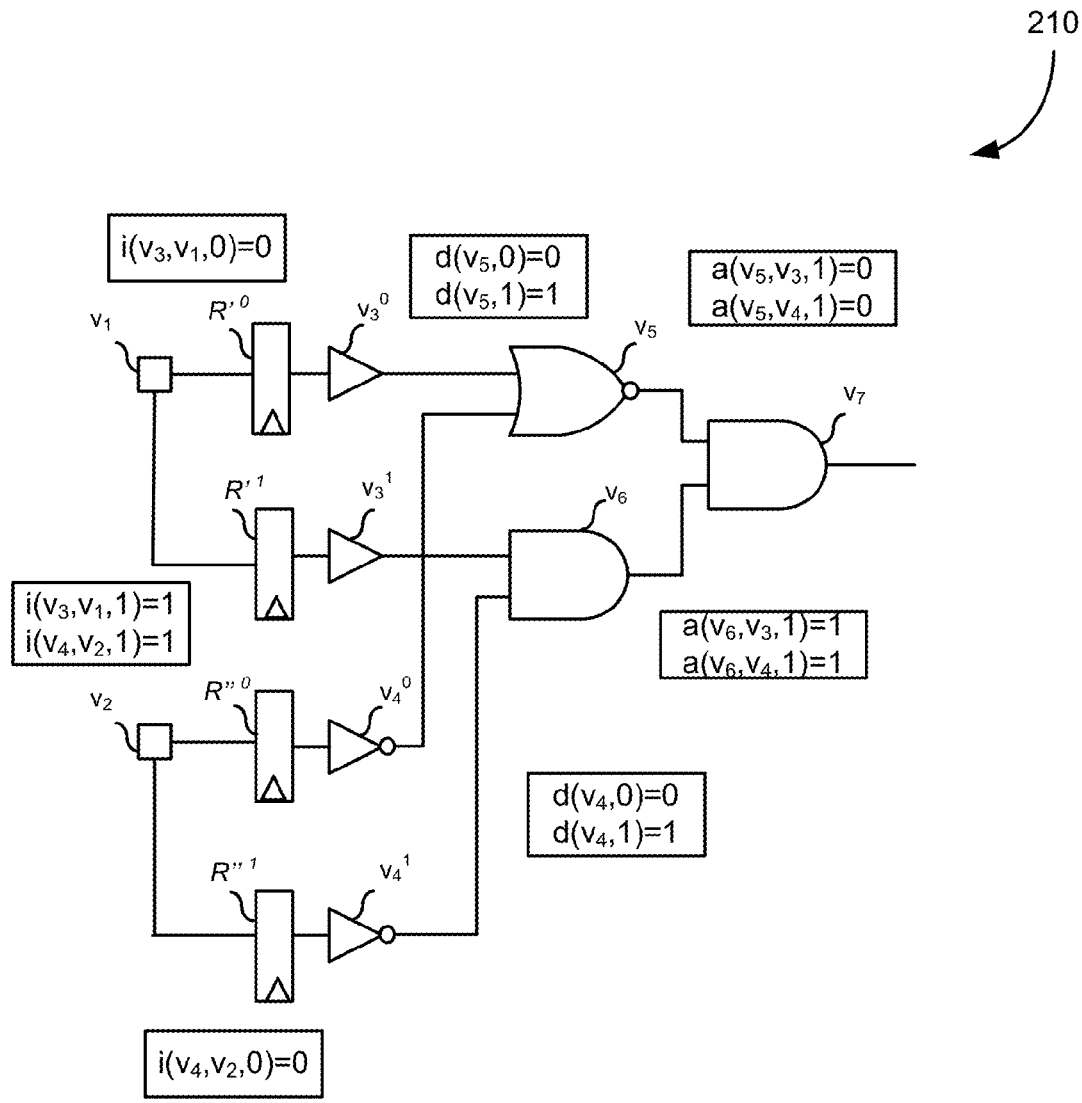
FIG. 2C illustrates a circuit diagram, in accordance with various embodiments.

Referring now to FIG. 2C, this figure shows the elements of FIG. 2B along with examples of the d function, the a function, and the i function, in accordance with various embodiments. In some embodiments, retiming duplication may be described by the d function, for which there are two true values for the duplicated gates. All other gates may only have one true d value. The a function, shown for gates $v_5$ and $v_6$, may be used to describe which of the copies to which each input may be connected. Additionally, the i function—which may be defined only on the edges with retimed registers—may be utilized to indicate an initial value of the register on the edge copy.

Figure 3A:
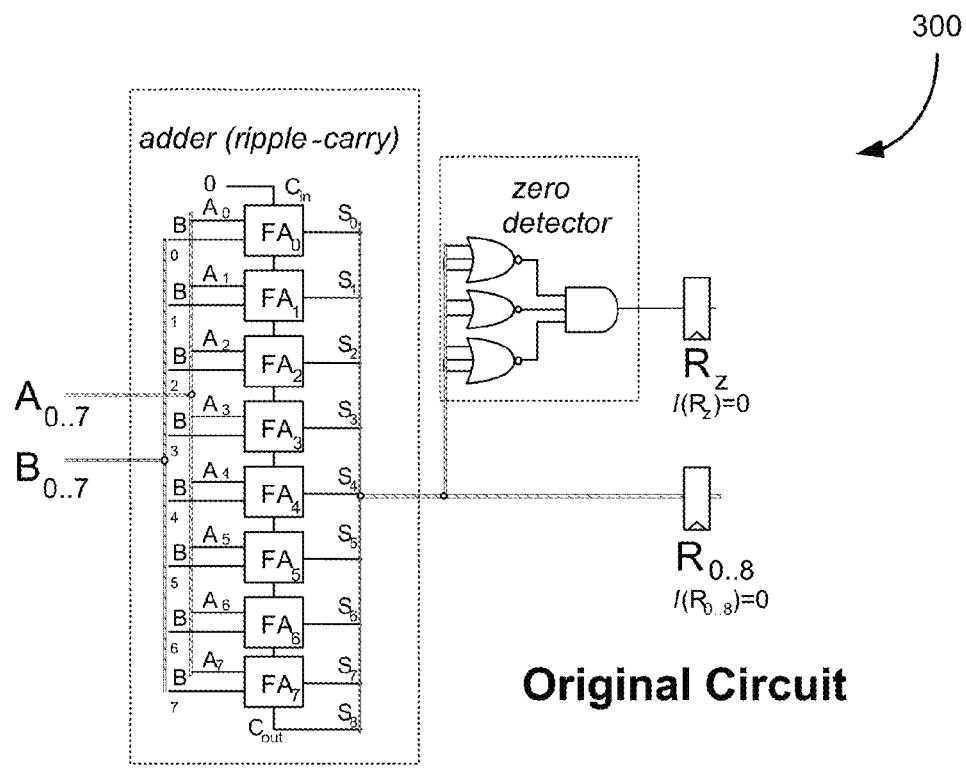
FIG. 3A illustrates a circuit diagram, in accordance with various embodiments.
Figure 3B:
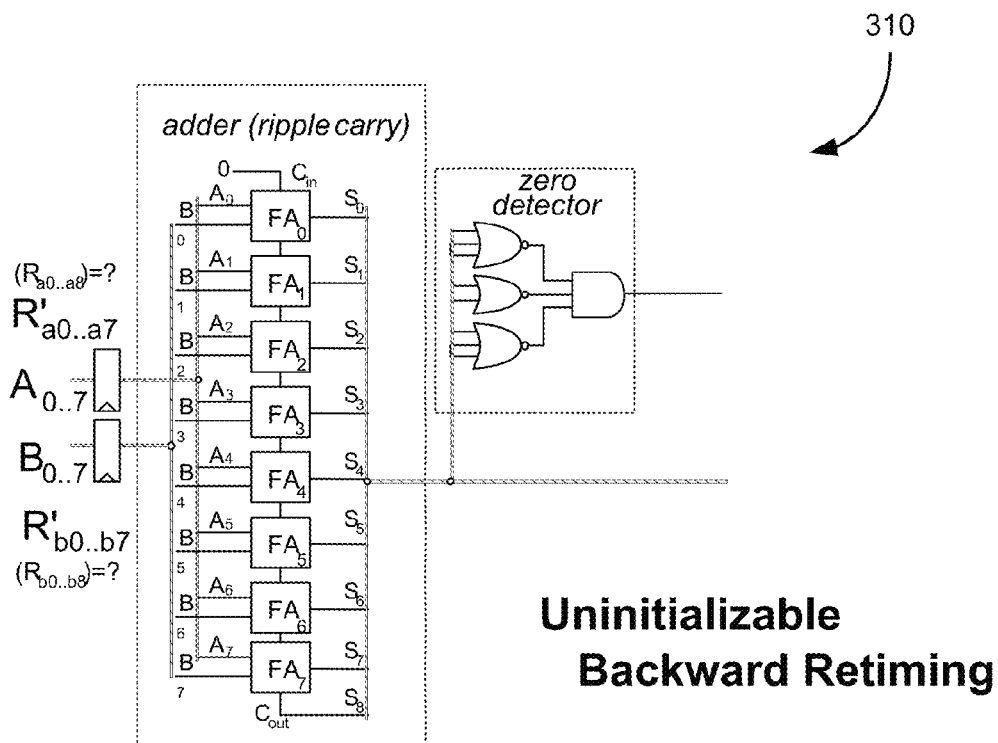
FIG. 3B illustrates a circuit diagram, in accordance with various embodiments.
Figure 3C:
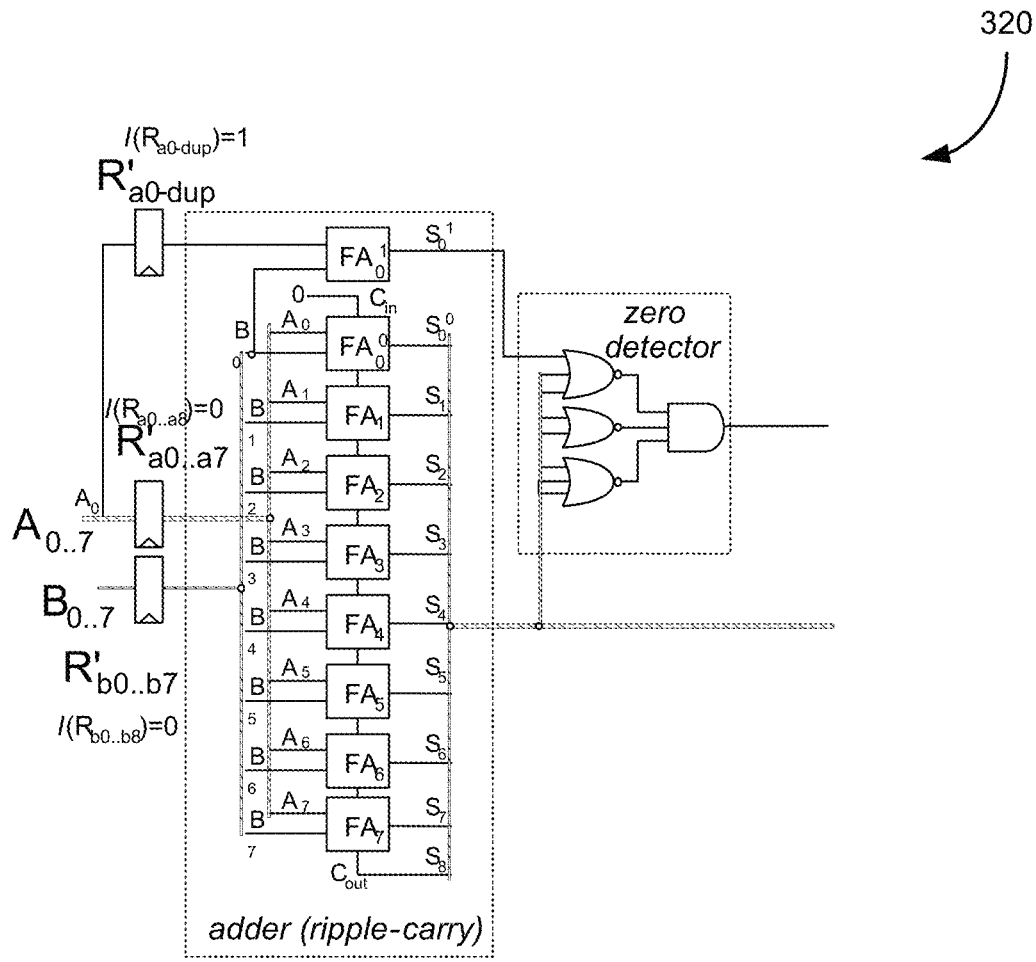
FIG. 3C illustrates a circuit diagram, in accordance with various embodiments.

Referring now to FIG. 3A, circuit diagram 300 is provided illustrating another example, in accordance with various embodiments. FIG. 3A shows circuit 300 with an 8-bit ripple-carry adder with zero detector on its output. FIG. 3B shows that circuit 300 is uninitializable after backward retiming to create circuit 310. One may note that this example may involve more than one conflict point. Zero detector imposes a constraint that may involve all of the bits (i.e. at least one input must be non-zero at initialization to produce the zero at its output as was the case in the original circuit). There may be multiple ways to address this. FIG. 3C shows circuit 320, which includes the duplication of adder $FA_0$ from circuits 310 of FIG. 3B. Duplicated adder is shown as adder $FA_0{}^1$. Duplication of adder $FA_0{}^1$, along with duplication of retimed register $R_{a0\text{-}dup}{}'$, combined with connecting these elements to circuit 320 results in fully backward-retimeable circuit utilizing logic duplication, in accordance with various embodiments. One may also note that other adders such as $FA_1$ to $FA_8$ could also be utilized to create a justifiable circuit, in accordance with various embodiments.

Figure 4A:
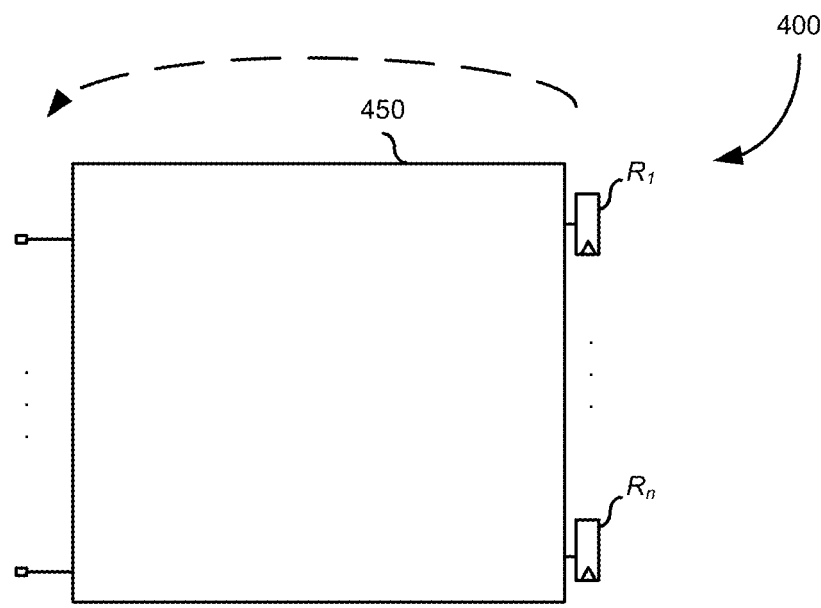
FIG. 4A illustrates a circuit diagram, in accordance with various embodiments.
Figure 4B:
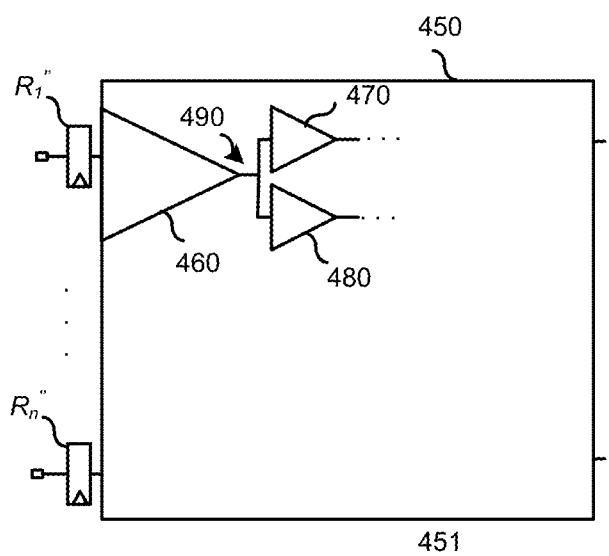
FIG. 4B illustrates a circuit diagram, in accordance with various embodiments.
Figure 4C:
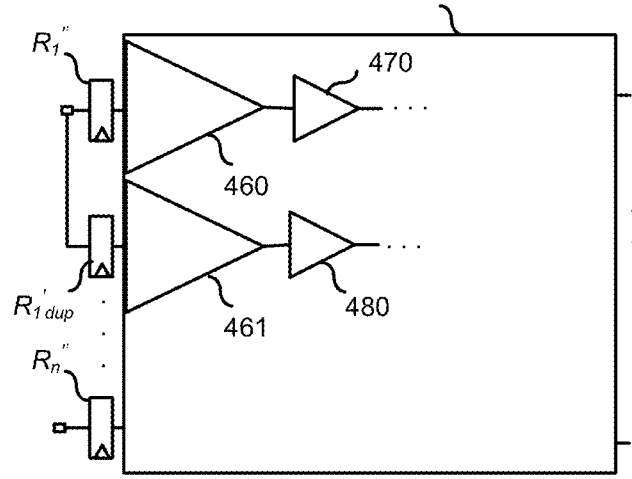
FIG. 4C illustrates a circuit diagram, in accordance with various embodiments.

Referring now to FIGS. 4A, 4B, and 4C, a set of generalized circuit diagrams are provided that may reflect different embodiments. FIG. 4A reflects circuit 400 with a set of registers $R_1, \ldots, R_n$ and circuit portion 450, which may be a combinational logic. FIG. 4B shows registers $R_1' \ldots, R_n'$ that may be relocated as part of a retiming process. Within the circuit portion 450, several subportions 460, 470, and 480 are shown. Between first portion 460 and second and third portion, 470 and 480, may be a conflict point 490. Conflict point 490 may reflect a point in a circuit where different logic values may be needed for two different portions of a circuit, such as second portion 470 and third portion 480, in order for the original functionality of the circuit to be preserved at all the outputs. FIG. 4C shows new circuit 451 with duplicated logic, in this case, first portion 460 having been duplicated as portion 461. Duplicated portion 461 may be inserted and connected with the circuit (connected to portions 470 and 480 in this case) to preserve the original circuit 450's functionality. In some cases, original portion 460 connections between this portion and other circuit portions may change; for example, in this example, portion 460 is now connected with portion 470, while duplicated portion 461 is connected for portion 480. In additional, a relocated or retimed register may also be duplicated. In this example, $R_1'$ is duplicated as $R_1'{}_{dup}$. Initial reset values may be determined for the relocated or retimed registers along with the duplicated registers in order to preserve the original functionality at all the outputs. Merely by way of example, $R_1'$ and $R_1'{}_{dup}$, may have different initial reset values.

The following merely provides a description of how to formulate the combined reset justification/logic duplication problem, in accordance with various embodiments. Other formulations may also be utilized with in the scope and spirit of this disclosure.

Utilizing the equations defined above, d(v,s), a(v,u,s), and, i(v,u,s) may represent independent variables. These equations can be utilized to describe how to duplicate, connect, and reset the resulting solution, respectively, in some embodiments. Each equation may refer to a resulting gate by its parents v and the particular copy by s, the post-reset trace sequence it may produce.

In some embodiments, a function $a_{ret}(v,u,s)$ may be utilized that may be completely described by a(v,u,s) and i(v,u,s) and the supplied pre- and post-retiming edge weights, $w_i(e)$ and $w_r(e)$. This may represent a cycle-shifted version of a that accounts for the lag of any original or retimed registers on an edge. The equation may be defined as follows:

$$a_{ret}(v, u, s) := \begin{cases} \text{push} & a(v, u, s), & \text{if } w_r(u \to v) = 1 \\ & i(v, u, s) \\ \text{pop} & a(v, u, s), & \text{if } w_i(u \to v) = 1 \\ & a(v, u, s) & \text{otherwise} \end{cases}.$$

In some embodiments, constraints on the variables of a combined reset justification/logic duplication problem may be formulated. In some embodiments, gates and registers used to produce the initialization sequence at a realized (implemented) gate output are duplicated, connected, and initialized. The correct initial values at the original register outputs can also be realized.

Some embodiments may include a constraint based on a post-reset trace sequence behavior. For a realized duplicate $v^s$, there may exist some realized fan-in gates whose initialization traces produce s at its output under some connection to its inputs. This may be represented as the following in some embodiments:

$$d(v,s) \Longrightarrow \forall (u \to v) \cdot d(u, a(v,s,u)) \hat{} f(a_{ret}(v,s,u_1), a_{ret}(v,s,u_2), \ldots) = s \qquad \text{(Constraint A)}.$$

For a trace to be produced, this constraint may force the existence of both the necessary fan-in gates and a valid set of connections.

Some embodiments may include a constraint based on a reset equivalence at the original register outputs. For any copy of an edge that had an original register, the first initialization value may be equivalent to that of the original register. This may be represented by the following in some embodiments:

$$d(v,s) \hat{} (w_r(u \to v) = 1) \Longrightarrow (\text{front } a(v,u,s) = I(u \to v)) \qquad \text{(Constraint B)}.$$

These constraints A and B can be sufficient to generate a legal solution for some embodiments. In some embodiments, a traditional SAT problem may be formulated that may decompose the S values into single-bit variables. Assuming that the local gate functions are well-behaved, a satisfying solution may be found. One solution may be to maximally duplicate and generate every possible post-reset trace sequence at every net (thereby including the valuations equivalent to the original circuit).

Some embodiments may also include reducing or minimizing the amount of logic that is duplicated while still finding a satisfying solution. In some embodiments, a partially-unsatisfying initial state and a strategic set of gates may be selected to be duplicated to minimize the additional area cost. Some embodiments may also minimizing other costs, such as an additional power cost. This can accomplished by introducing and minimizing a pseudo-Boolean cost function with the satisfiability problem. There exist several known methods to incorporate pseudo-Boolean constraints into a SAT problem. Other functional analysis methods may be applied in some embodiments, including but not limited to utilizing automatic test pattern generation (ATGP) or binary decision diagrams (BDD).

Merely by way of example, let $c_g(v)$ be a cost of duplicating a gate v, and $c_r(v)$ be the cost of duplicating a register driven by v. If β is a maximum allowable additional cost, a constraint may be formulated as:

$$\sum_{\forall v,s} c_g(v) d(v, s) + c_r(v) \exists (w, t).(i(v, w, t) = 0) + c_r(v) \exists (w, t).(i(v, w, t) = 1) < \beta.$$

In one embodiment, to manage the complexity of the resulting Boolean constraints, a reasonable solution can be achieved by simply minimizing the number of combinational gates that are duplicated: here, $c_g(v)=1$ and $c_r(v)=0$. The additional problem structure may then be equivalent to an adder of width $|V|$.

Merely by way of example, the equivalence of a duplicated versus post-retiming circuits may be shown inductively on the structure of the netlist. If it is assumed that the fan-in u of gate v is equivalent to the fan-in $u^r$ of gate $v^s$, then because of the preservation of set-wise connectivity, the inputs of v and $v^r$ are equivalent in some embodiments. Furthermore, because $v^r$ may be a cloned copy of v, the local functions may also be identical. It follows that the outputs may be equivalent. The base case is defined at the shared unduplicated inputs (which must exist if the circuit remains connected).

Figure 5:
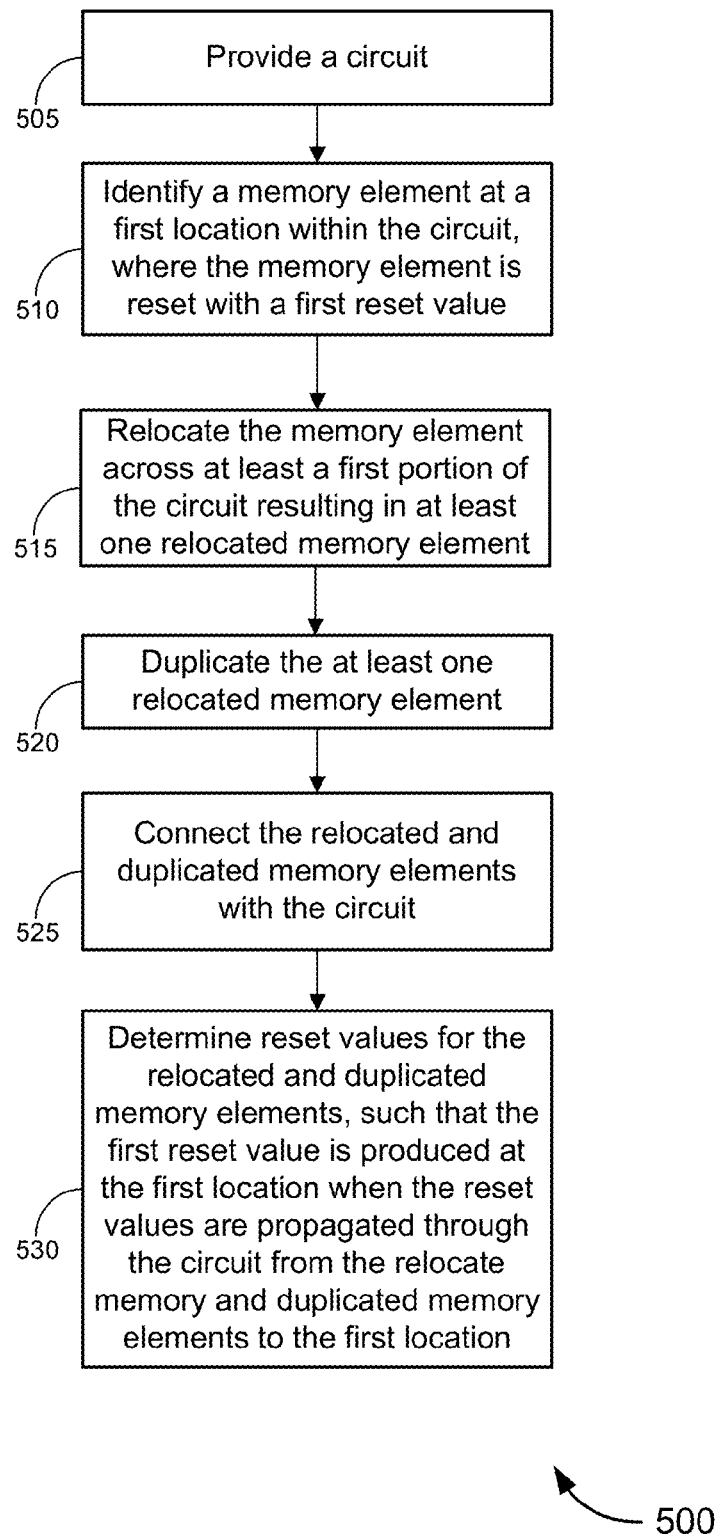
FIG. 5 illustrates a flow chart reflecting a method of logic synthesis for preserving a reset behavior of a circuit, in accordance with various embodiments.

Referring to FIG. 5, this figures shows a flow chart for method 500 of logic synthesis for preserving a reset behavior of a circuit. Method 500 may be implemented using aspects discussed above with respect to FIGS. 1-4. At block 505, a circuit is provided. At block 510, a memory element at a first location is identified within the circuit. The memory element has a first reset value, or a initial reset value. In some embodiments, multiple memory elements at different locations along with their reset values may be identified. At block 515, the memory element(s) are relocated across at least a portion of the circuit. Different memory elements may be relocated across different portions of the circuit. This relocation results in relocated memory elements. In some cases, when a memory element is relocated, it may result in multiple relocated memory elements. In some embodiments, this step of relocating memory elements may be a backward retiming. In some embodiments, the portion of the circuit that a memory element is relocated or retimed across may consist only of a combinational logic.

At block 520, at least one of the relocated or retimed memory elements is duplicated. At block 525, the relocated and/or duplicated memory elements are connected with the circuit. In some embodiments, a portion of the circuit may be duplicated. In some cases, the portion of the circuit that is duplicated is part of the portion of the circuit that the memory elements are relocated across. In some embodiments, this second portion of the circuit may consist only of a combinational logic. In some embodiments, connecting the duplicated second portion of the circuit and/or the relocated and duplicated memory elements may preserve a topology of the circuit. Connecting these duplicated and/or relocated registers and/or combinational logic may preserve a length and/or a composition of a longest timing path of the circuit in some embodiments.

At block 530, reset values for the relocated and/or duplicated memory elements are determined. These reset values are determined such that the initial reset values for the memory elements that were relocated are produced when the reset values for the relocated and/or duplicated memory elements are propagated through the circuit to the memory elements' locations.

In some embodiments, duplicating portions of the circuit may involve minimizing the amount of the circuit that is duplicated. This may involve minimizing an additional area cost in some embodiments. Minimizing the portion of circuit that is duplicated may involve minimizing an additional power cost in some embodiments. Minimizing these costs may include minimizing a pseudo-Boolean cost function with a satisfiability problem in some embodiments. In some embodiments, duplicating a portion of the circuit may include duplicating the portion of the circuit over which a memory element has been relocated or retimed.

Figure 6:
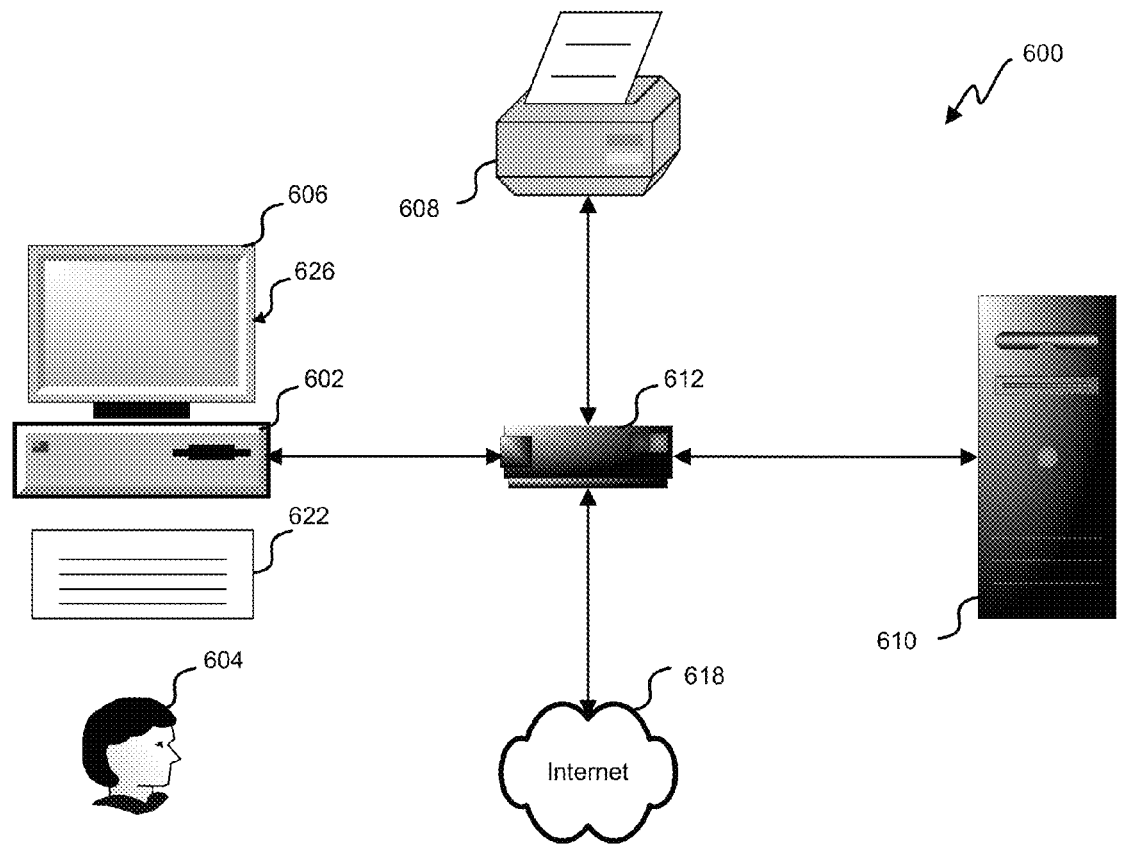
FIG. 6 depicts a block diagram of an embodiment of a CAD system.

Embodiments utilizing logic duplication as disclosed may be implemented on commercial logic synthesis tool. Referring next to FIG. 6, an exemplary environment with which embodiments of the invention may be implemented is shown with a computer aided design (CAD) system 600 that can be used by a designer 604 to design, for example, electronic circuits. The CAD system 600 can include a computer 602, keyboard 622, a network router 612, a printer 608, and a monitor 606. The monitor 606, processor 602 and keyboard 622 are part of a computer system 626, which can be a laptop computer, desktop computer, handheld computer, mainframe computer, etc. The monitor 606 can be a CRT, flat screen, etc.

A circuit designer 604 can input commands into the processor 602 using various input devices, such as a mouse, keyboard 622, track ball, touch screen, etc. If the CAD system 600 comprises a mainframe, a designer 604 can access the computer 602 using, for example, a terminal or terminal interface. Additionally, the computer system 626 may be connected to a printer 608 and a server 610 using a network router 612, which may connect to the Internet 618 or a WAN.

The server 610 may, for example, be used to store additional software programs and data. In one embodiment, software implementing the systems and methods described herein can be stored on a storage medium in the server 610. Thus, the software can be run from the storage medium in the server 610. In another embodiment, software implementing the systems and methods described herein can be stored on a storage medium in the computer 602. Thus, the software can be run from the storage medium in the computer system 626. Therefore, in this embodiment, the software can be used whether or not computer 602 is connected to network router 612. Printer 608 may be connected directly to computer 602, in which case, the computer system 626 can print whether or not it is connected to network router 612.

Figure 7:
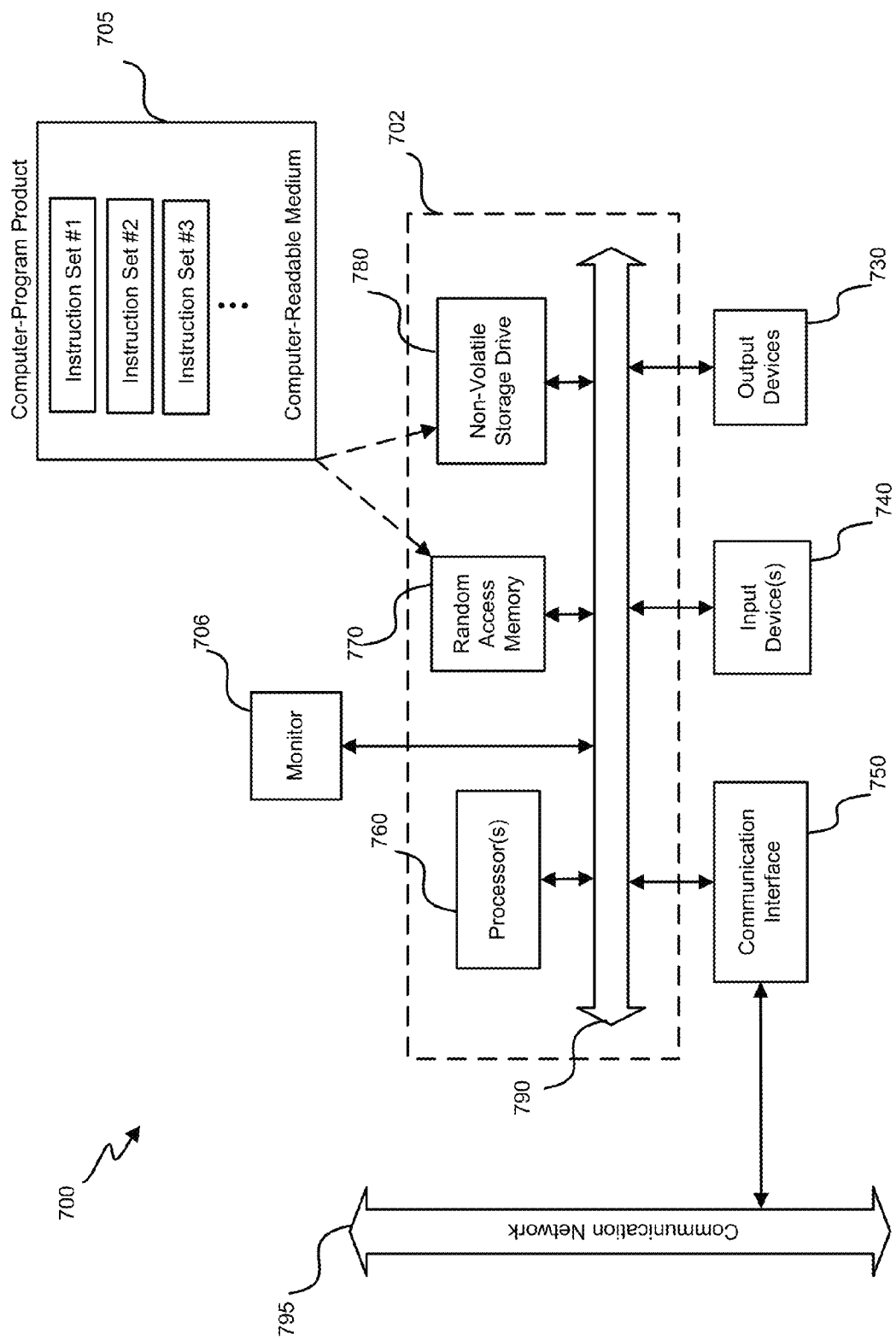
FIG. 7 depicts a block diagram of an embodiment of a special-purpose computer.

With reference to FIG. 7, an embodiment of a special-purpose computer system 700 is shown. The above methods may be implemented by computer-program products that direct a computer system to perform the actions of the above-described methods and components. Each such computer-program product may comprise sets of instructions (codes) embodied on a computer-readable medium that directs the processor of a computer system to perform corresponding actions. The instructions may be configured to run in sequential order, or in parallel (such as under different processing threads), or in a combination thereof. After loading the computer-program products on a general purpose computer system 626, it is transformed into the special-purpose computer system 700 for CAD.

Special-purpose computer system 700 comprises a computer 602, a monitor 606 coupled to computer 602, one or more additional user output devices 730 (optional) coupled to computer 602, one or more user input devices 740 (e.g., keyboard, mouse, track ball, touch screen) coupled to computer 602, an optional communications interface 750 coupled to computer 602, a computer-program product 705 stored in a tangible computer-readable memory in computer 602. Computer-program product 705 directs system 700 to perform the above-described methods. Computer 602 may include one or more processors 760 that communicate with a number of peripheral devices via a bus subsystem 790. These peripheral devices may include user output device(s) 730, user input device(s) 740, communications interface 750, and a storage subsystem, such as random access memory (RAM) 760 and non-volatile storage drive 780 (e.g., disk drive, optical drive, solid state drive), which are forms of tangible computer-readable memory.

Computer-program product 705 may be stored in non-volatile storage drive 780 or another computer-readable medium accessible to computer 602 and loaded into memory 760. Each processor 760 may comprise a microprocessor, such as a microprocessor from Intel® or Advanced Micro Devices, Inc.®, or the like. To support computer-program product 705, the computer 602 runs an operating system that handles the communications of product 705 with the above-noted components, as well as the communications between the above-noted components in support of the computer-program product 705. Exemplary operating systems include Windows® or the like from Microsoft Corporation, Solaris® from Sun Microsystems, LINUX, UNIX, and the like.

User input devices 740 include all possible types of devices and mechanisms for inputting information to computer system 602. These may include a keyboard, a keypad, a mouse, a scanner, a digital drawing pad, a touch screen incorporated into the display, audio input devices such as voice recognition systems, microphones, and other types of input devices. In various embodiments, user input devices 740 are typically embodied as a computer mouse, a trackball, a track pad, a joystick, wireless remote, a drawing tablet, a voice command system. User input devices 740 typically allow a user to select objects, icons, text and the like that appear on the monitor 606 via a command such as a click of a button or the like. User output devices 730 include all possible types of devices and mechanisms for outputting information from computer 602. These may include a display (e.g., monitor 606), printers, non-visual displays such as audio output devices, etc.

Communications interface 750 provides an interface to other communication networks and devices and may serve as an interface for receiving data from and transmitting data to other systems, WANs and/or the Internet 618. Embodiments of communications interface 750 typically include an Ethernet card, a modem (telephone, satellite, cable, ISDN), a (asynchronous) digital subscriber line (DSL) unit, a FireWire® interface, a USB® interface, a wireless network adapter, and the like. For example, communications interface 750 may be coupled to a computer network, to a FireWire® bus, or the like. In other embodiments, communications interface 750 may be physically integrated on the motherboard of computer 602, and/or may be a software program, or the like.

RAM 770 and non-volatile storage drive 780 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMs, DVDs, bar codes, semiconductor memories such as flash memories, read-only-memories (ROMs), battery-backed volatile memories, networked storage devices, and the like. RAM 770 and non-volatile storage drive 780 may be configured to store the basic programming and data constructs that provide the functionality of various embodiments of the present invention, as described above.

Software instruction sets that provide the functionality of the present invention may be stored in RAM 770 and non-volatile storage drive 780. These instruction sets or code may be executed by the processor(s) 760. RAM 770 and non-volatile storage drive 780 may also provide a repository for storing data and data structures used in accordance with the present invention. RAM 770 and non-volatile storage drive 780 may include a number of memories including a main random access memory (RAM) for storage of instructions and data during program execution and a read-only memory (ROM) in which fixed instructions are stored. RAM 770 and non-volatile storage drive 780 may include a file storage subsystem providing persistent (non-volatile) storage for program and/or data files. RAM 770 and non-volatile storage drive 780 may also include removable storage systems, such as removable flash memory.

Bus subsystem 790 provides a mechanism for letting the various components and subsystems of computer 602 communicate with each other as intended. Although bus subsystem 790 is shown schematically as a single bus, alternative embodiments of the bus subsystem may utilize multiple busses or communication paths within the computer 602.

While the principles of the disclosure have been described above in connection with specific apparatuses, systems, and methods, it is to be clearly understood that this description is made only by way of example and not as limitation on the scope of the disclosure.

What is claimed is:

1. A computer-implemented method of logic synthesis for preserving a reset behavior of a circuit, the method comprising:
   providing the circuit;
   identifying a memory element at a first location within the circuit, wherein the memory element is reset with a first reset value;
   relocating the memory element across at least a first portion of the circuit resulting in at least one relocated memory element;
   duplicating the at least one relocated memory element;
   connecting the at least one relocated memory element and the at least one duplicated memory element with the circuit;
   determining, by using a computer, a plurality of reset values for the at least one relocated memory element and the at least one duplicated memory element, wherein the first reset value is produced at the first location when the plurality of reset values are propagated through the circuit from the at least one relocated memory element and the at least one duplicated memory element to the first location;
   duplicating a second portion of the circuit, wherein the first portion of the circuit includes the second portion of the circuit; and
   connecting the duplicated second portion of the circuit with the circuit and the at least one relocated memory element and the at least one duplicated memory element.

2. The method of logic synthesis for preserving a reset behavior of a circuit of claim 1, wherein relocating the memory element includes a retiming of the memory element.

3. The method of logic synthesis for preserving a reset behavior of a circuit of claim 1, wherein connecting the duplicated second portion of the circuit preserves a topology of the circuit.

4. The method of logic synthesis for preserving a reset behavior of a circuit of claim 1, wherein connecting the duplicated second portion of the circuit preserves a length and a composition of a longest timing path of the circuit.

5. The method of logic synthesis for preserving a reset behavior of a circuit of claim 1, further comprising minimizing the duplicated second portion of the circuit.

6. The method of logic synthesis for preserving a reset behavior of a circuit of claim 1, wherein duplicating the second portion of the circuit minimizes an additional area cost.

7. The method of logic synthesis for preserving a reset behavior of a circuit of claim 6, wherein minimizing the additional area cost includes minimizing a pseudo-Boolean cost function with a satisfiability problem.

8. A system for performing logic synthesis that preserves a reset behavior of a circuit, the system comprising:
- a non-transitory computer readable storage medium;
- a processor coupled with the non-transitory computer readable storage medium, the processor configured to preserve the reset behavior of the circuit by a configuration to:
  - provide the circuit;
  - identify a memory element at a first location within the circuit; wherein the memory element is reset with a first reset value;
  - relocate the memory element across at least a first portion of the circuit resulting in at least one relocated memory element;
  - duplicate the at least one relocated memory element;
  - connect the at least one relocated memory element and the at least one duplicated memory element with the circuit;
  - determine a plurality of reset values for the at least one relocated memory element and the at least one duplicated memory element, wherein the first reset value is produced at the first location when the plurality of reset values are propagated through the circuit from the at least one relocated memory element and the at least one duplicated memory element to the first location;
  - duplicate a second portion of the circuit, wherein the first portion of the circuit includes the second portion of the circuit; and
  - connect the duplicated second portion of the circuit with the circuit and the at least one relocated memory element and the at least one duplicated memory element.

9. The system for performing logic synthesis that preserves a reset behavior of a circuit of claim 8, wherein the first portion of the circuit consists of a combinational logic.

10. The system for performing logic synthesis that preserves a reset behavior of a circuit of claim 8, wherein the second portion of the circuit consists of a combinational logic.

11. The system for performing logic synthesis that preserves a reset behavior of a circuit of claim 8, wherein the retiming of the memory element is a backward retiming.

12. The system for performing logic synthesis that preserves a reset behavior of a circuit of claim 8, wherein connecting the duplicated second portion of the circuit preserves a topology of the circuit.

13. The system for performing logic synthesis that preserves a reset behavior of a circuit of claim 8, wherein connecting the duplicated second portion of the circuit preserves a length and a composition of a longest timing path of the circuit.

14. The system for performing logic synthesis that preserves a reset behavior of a circuit of claim 8, wherein the processor further configured to preserve the reset behavior of the circuit by a configuration to minimize the duplicated second portion of the circuit.

15. The system for performing logic synthesis that preserves a reset behavior of a circuit of claim 8, wherein duplicating the second portion of the circuit minimizes an additional power cost.

16. The system for performing logic synthesis that preserves a reset behavior of a circuit of claim 15, wherein minimizing the additional power cost includes minimizing a pseudo-Boolean cost function with a satisfiability problem.

17. A non-transitory machine-readable storage medium comprising executable instructions for performing a logic synthesis that preserves a reset behavior of a circuit, the executable instructions comprising code—which, when executed by a computer, results in:
- providing the circuit;
- identifying a memory element at a first location within the circuit; wherein the memory element is reset with a first reset value;
- relocating the memory element across at least a first portion of the circuit resulting in at least one relocated memory element;
- duplicating the at least one relocated memory element;
- connecting the at least one relocated memory element and the at least one duplicated memory element with the circuit;
- determining a plurality of reset values for the at least one relocated memory element and the at least one duplicated memory element, wherein the first reset value is produced at the first location when the plurality of reset values are propagated through the circuit from the at least one relocate memory element and the at least one duplicated memory element to the first location;
- duplicating a second portion of the circuit, wherein the first portion of the circuit includes the second portion of the circuit; and
- connecting the duplicated second portion of the circuit with the circuit and the at least one relocated memory element and the at least one duplicated memory element.

18. The non-transitory machine-readable storage medium of claim 17, wherein relocating the memory element includes a retiming of the memory element.

19. The non-transitory machine-readable storage medium of claim 17, further comprising reducing the duplicated second portion of the circuit.

20. The non-transitory machine-readable storage medium of claim 17, wherein duplicating the second portion of the circuit reduces an additional area cost.

21. The non-transitory machine-readable storage medium of claim 17, wherein duplicating the second portion of the circuit reduces an additional power cost.

* * * * *